(12) United States Patent
Arvin et al.

(10) Patent No.: US 8,268,716 B2
(45) Date of Patent: Sep. 18, 2012

(54) CREATION OF LEAD-FREE SOLDER JOINT WITH INTERMETALLICS

(75) Inventors: Charles L. Arvin, Poughkeepsie, NY (US); Valerie Oberson, Quebec (CA); Srinivasa N. Reddy, LeGrangeville, NY (US); Krystyna W. Semkow, Poughquag, NY (US); Richard A. Shelleman, Poughkeepsie, NY (US); Kamalesh K. Srivistava, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 51 days.

(21) Appl. No.: 12/894,231

(22) Filed: Sep. 30, 2010

(65) Prior Publication Data

US 2012/0083113 A1 Apr. 5, 2012

(51) Int. Cl.
*H01L 21/44* (2006.01)
(52) U.S. Cl. ........ 438/613; 438/612; 438/614; 438/615; 257/E21.508; 257/E21.51; 257/E23.021; 257/E21.509
(58) Field of Classification Search .......... 438/612–615, 438/FOR. 343; 257/E21.508, E21.51, E23.021, 257/E21.509
See application file for complete search history.

(56) References Cited

U.S. PATENT DOCUMENTS

| 5,503,286 A * | 4/1996 | Nye et al. ........................ 216/13 |
| 5,520,752 A | 5/1996 | Lucey, Jr. et al. |
| 5,863,493 A | 1/1999 | Achari et al. |
| 6,489,229 B1 * | 12/2002 | Larsen et al. .................. 438/614 |
| 2006/0292824 A1 * | 12/2006 | Beyne et al. ................... 438/455 |
| 2009/0020590 A1 | 1/2009 | Knickerbocker et al. |
| 2009/0197103 A1 | 8/2009 | Shih et al. |
| 2009/0197114 A1 | 8/2009 | Shih et al. |
| 2009/0206479 A1 * | 8/2009 | Daubenspeck et al. ........ 257/738 |
| 2009/0243098 A1 | 10/2009 | Farooq et al. |

FOREIGN PATENT DOCUMENTS

JP 03173190 7/1991

OTHER PUBLICATIONS

Gan, et al.; "Effect of Electromigration on Intermetallic Compound Formation in Pb-Free Solder—Cu Interfaces"; 2002 Electronic Components and Technology Conference; p. 1206-1212; 2002.
"Mini-Cu Vias for 3D Connections"; p. 1-4; IP.com PriorArtDatabase, Apr. 29, 2009; http://www.ip.com/pubview/IPCOM000182403D.
Lin, et al.; "The Electromigration and Thermomigration Behaviors of Pb-Free Flip Chip Sn-3Ag-0.5Cu Solder Bumps"; 2006 Electronics Components and Technology Conference; p. 667-672; 2006.
Perfecto, et al.; "Chip to Carrier C4 Technology Challenges With Pb-Free Solders"; IEEE 2008 Custom Integrated Circuits Conference (CICC); p. 81-84; 2008.
Aintila, et al.; "Electroless Ni/Au Bumps for Flipchip-on-Flex and TAB Applications", 1994 IEEE/CPMT Int'l Electronics Manufacturing Technology Symposium; p. 160-164; 1994.

* cited by examiner

*Primary Examiner* — Michelle Mandala
(74) *Attorney, Agent, or Firm* — Cantor Colburn LLP; Joseph Petrokaitis

(57) ABSTRACT

A method of coupling an integrated circuit to a substrate includes providing the substrate, forming a contact pad in the substrate, contacting the contact pad with a solder ball, and repeatedly exposing the solder ball to a thermal process to cause intermetallics based on a metal in the contact pad to be formed in the thermal ball.

16 Claims, 5 Drawing Sheets

CREATION OF LEAD-FREE SOLDER JOINT WITH INTERMETALLICS

BACKGROUND

The present invention relates to integrated circuits and, more specifically, to joining integrated circuits together.

Controlled-collapse chip connection (C4) is a means of connecting integrated circuit (IC) chips to substrates in electronic packages. C4 is known as a flip-chip technology, in which the interconnections are small solder balls on the bottom side chip surface. C4 technology represents one of the highest density schemes known in the art for chip interconnections. Historically, the PbSn (lead-tin) solder for the formation of the solder ball was evaporated through a metal mask. In the 1990's, electrochemical fabrication of C4 interconnections was introduced. Electroplating is more extendible than evaporation to small C4-pad dimensions, closer pad spacing, larger wafers, and lower-melting solders (which have a higher content of tin (Sn)).

In general, the top layers of an integrated circuit (IC) chip are wiring levels, separated by insulating layers of dielectric material that provide input/output for the device. In C4 structures, the chip wiring is terminated by a plurality of metal films that form the ball-limiting metallurgy (BLM), which is also referred to as under-bump metallurgy (UBM). The ball-limiting metallurgy defines the size of the solder bump after reflow, provides a surface that is wettable by the solder, and that reacts with the solder to provide good adhesion and acceptable reliability under mechanical and heat stress. The BLM also serves as a barrier between the integrated-circuit device and the metals in the interconnection.

FIGS. 1A and 1B are a typical implementation of the C4 manufacturing process. In FIG. 1A an integrated circuit (IC) 100 formed on a base material 102 (for example, silicon) has a solder ball 108 formed for subsequent attachment to a contact pad 112 (see FIG. 1B) on a carrier 114. A BLM 106 constricts the solder flow and aids in the formation of the solder ball 108 (which is formed by reflowing a deposit of solder paste), and serves as a wettable surface and contact for an underlying contact 110 for the IC 100. A passivation layer 104, typically a polymer dielectric, insulates the IC 100, and supports the BLM 106. In FIG. 1B the IC 100 is attached to the contact pad 112 on the carrier 114, by reflowing the solder ball 108. Solder flow is restricted on the carrier 114 by solder dams 116, which outline and define the contact pad 112. A secondary reflow is employed to attach the IC 100 to the contact pad 112 on the carrier 114.

Certain state and federal regulations have limited or eliminated the use of lead based solder. One approach to complying with these regulations includes utilizing tin (Sn) based lead-free solders. Sn has a tetragonal crystal symmetry that exhibits anisotropic properties such related to elastic constants and diffusion of solute atoms through the Sn. In first orientation of the Sn particles, elements that form the contact pad 112 (e.g., copper (Cu) or nickel (Ni)) diffuse under an electric field at a rate thousands of times slower than when the particles in a second orientation perpendicular to that of the first orientation. Solder balls 108 having the first orientation (e.g., with low diffusion) exhibit a slow/controllable failure of joint known as Mode 1 electromigration failure herein. In this mode, the failure has a formation of voids near the surface of the BLM 106. For solder balls having the second orientation (e.g., perpendicular to the orientation for Mode 1), a failure known as Mode 2 electromigration failure herein occurs. Mode 2 failure is characterized by the movement of intermetallics from the carrier 114 to the BLM 106 or vice-versa. The possibility of mode 2 failures make tin based lead-free solder balls 108 unfit for the high-end applications requiring long life (e.g., 100 k Hr) at elevated temperatures (e.g. 100 C).

Several efforts are in progress to make the ball 108 an agglomerate of large number of randomly oriented grains to reduce the effective mass flow of Cu or Ni perpendicular to the BLM 106. However, due to the small size of the ball 108, the number of grains per ball 108 is limited to less than 5.

SUMMARY

According to one embodiment of the present invention, a method of coupling an integrated circuit to a substrate is disclosed. The method of this embodiment includes providing the substrate; forming a contact pad in the substrate; contacting the contact pad with a solder ball; and repeatedly exposing the solder ball to a thermal process to cause intermetallics based on a metal in the contact pad to be formed in the thermal ball.

According to another embodiment of the present invention another method of coupling an integrated circuit to a substrate is disclosed. This method includes providing the substrate; forming a contact pad in the substrate; contacting the contact pad with a solder ball; and exposing the solder ball to a thermal process until a desired amount of intermetallics based on a metal in the contact pad are formed in the solder ball.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

According to one embodiment of the present invention, Mode 2 failure may be reduced or eliminated by slowing down the diffusion of the carrier 114 atoms (e.g. Cu and Ni) through the tin grains in the ball 108 in the case of the second orientation.

In one embodiment, Cu—Sn or Ni—Sn intermetallics are nearly uniformly distributed through the solder ball 108. These intermetallic particles act as barrier boulders to the movement of the solute atoms (Cu or Ni) under the influence of the electric field. For example, when the electric field is applied such that electron flow occurs from BLM 106 to contact pad 112, the solute atoms tend to move from top to bottom. However, upon impingement of a moving atom (under the influence of the electric field) with intermetallic particles, either the movement of the atom comes to a complete halt or the moving atom must change the direction. If the tin grain is oriented in the first orientation, the impingement of the solute atom results into change of direction. Any change of direction will slow down the moving atom thousands of times. The net result is that the mode 2 type of catastrophic electromigration failure is eliminated. To that end, embodiments of the present invention are directed forming intermetallics in the solder ball 108. Indeed, controlling the amount of intermetallics in the ball 108 may also allow for the control of the hardness of the ball 108.

In particular, one embodiment includes introducing intermetallics into the ball 108 via thermal processing. In one embodiment, this may be accomplished by exposing the ball 108 to heat (either repeatedly or for a particular amount of time) to control the amount of intermetallics disposed therein. The intermetallics may come from particles in the contact pad 112 in one embodiment.

Figure 1A:
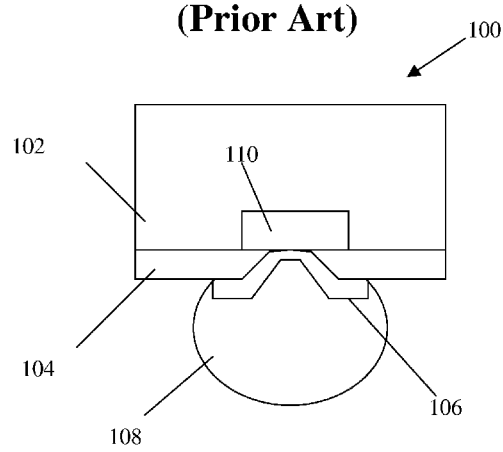
FIGS. 1a and 1b show a typical implementation of the C4 manufacturing process.
Figure 1B:
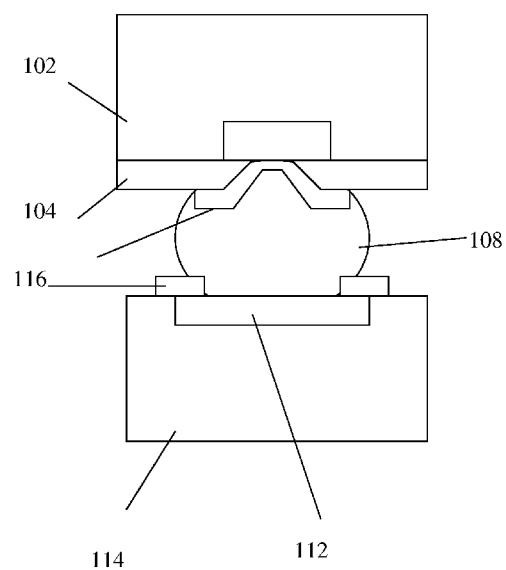
Figure 2:
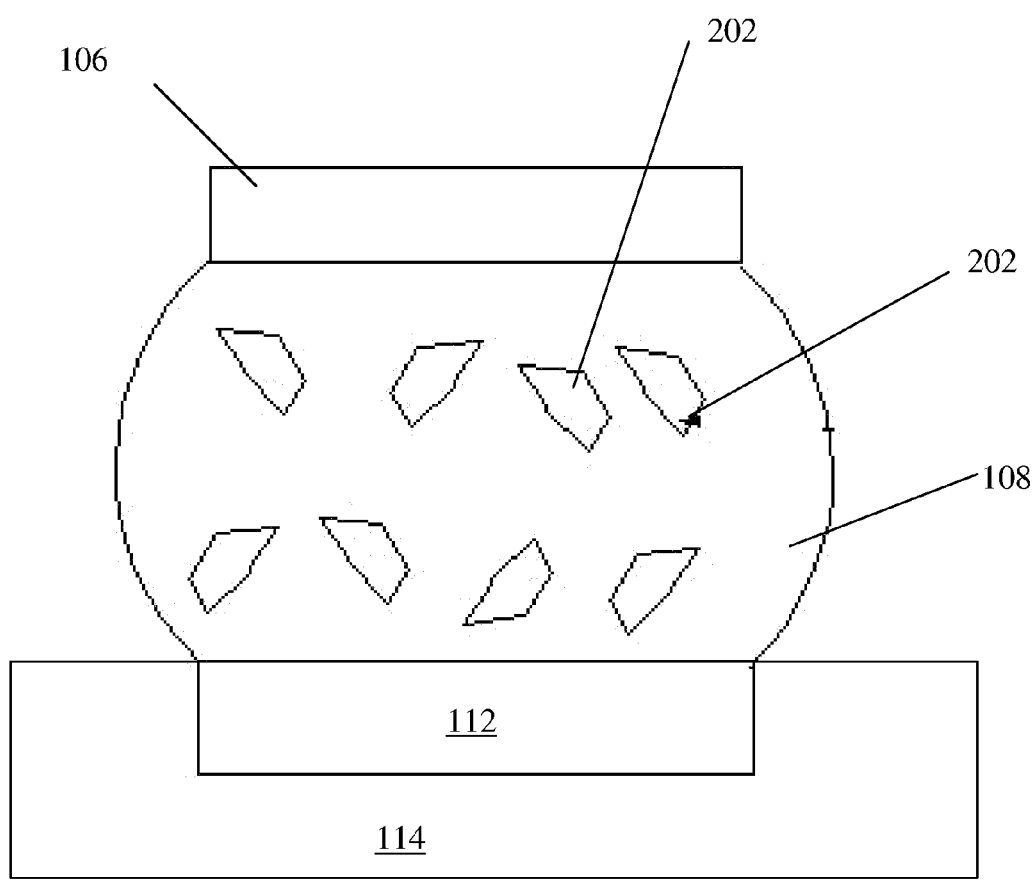
FIG. 2 shows a solder ball interspersed with intermetallics according to one embodiment.

FIG. 2 shows an example of a ball 108 having intermetallics 202 formed therein. The ball 108 is shown coupled to a BLM 106 and to a contact pad 112. The contact 112 is disposed within a carrier 114. In one embodiment, the carrier 114 is formed of a ceramic material.

In one embodiment, the intermetallics 202 are caused to form in the ball 108 due to repeated exposure of the ball 108 to heat while the ball 108 is coupled to one or both the BLM 106 or the contact pad 112. In one embodiment, the ball 108 is coupled to the contact back 112 and then exposed to one or more thermal processes that cause the intermetallics 202 to form in the ball 108 before being coupled to the BLM 106. In such an embodiment, the intermetallics 202 are composed, at least partially, of the materials that form the contact pad 112. The thermal processes may include exposing the ball to 108 to heat that exceeds a reflow temperature for the ball 108 multiple times or for an extended period of time. For example, the ball 108 may be exposed to heat equal to or exceeding the reflow temperature for greater than 3 minutes.

Figure 3:
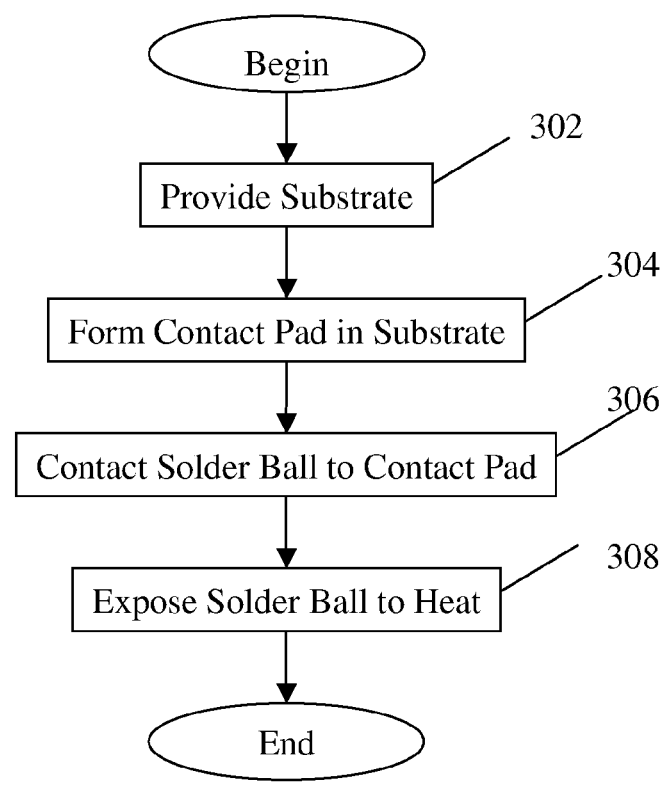
FIG. 3 shows a method according to one embodiment.

FIG. 3 shows a method according to one embodiment of the present invention. At block 302, a substrate (e.g., carrier 114) is provided. In one embodiment, the substrate is formed of a ceramic material. After the substrate is provided, a contact pad is formed in the substrate at block 304. In one embodiment, the contact pad is formed of a single layer. In another embodiment, the contact pad is formed of multiple layers of different materials. For example, the contact pad may be formed of sintered Cu or Ni overlaid by a layer of electroless gold.

At block 306 a solder ball is brought into contact with the contact pad. The solder ball is a Ti based solder ball in one embodiment. Of course, the solder ball could be formed of any suitable solder material. The solder ball is connected to a BLM at some point before block 306 in one embodiment. Of course, the solder ball could be formed directly on the contact pad before being coupled to a BLM in one embodiment.

Regardless, at block 308 the solder ball and the contact pad are exposed to heat sufficient to cause materials in the contact pad to migrate into the solder ball. The exposure to heat may include exposing the contact pad and solder ball to heat multiple times in one embodiment. Of course, in another embodiment, varying the time of single exposure may achieve the same results. In one embodiment, the solder ball is exposed to 10 or more reflow conditions as part of block 308. In the prior art, only two reflows were typically performed, one to couple the ball of the BLM and another to couple the ball to the contact pad. It will be understood that varying the number of thermal exposures or time of thermal exposure will vary the amount of intermetallic migration and, thus, the hardness of the resultant solder ball.

Figure 4:
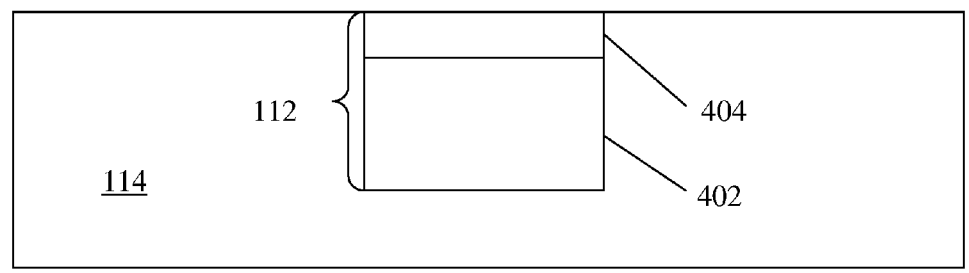
FIG. 4 shows an example of a contact pad according to one embodiment.

FIG. 4 shows an example of a contact pad 112 disposed in a carrier 114. In the embodiment, the carrier 114 is formed of a ceramic material. The contact pad 112 of this embodiment is formed of a base sintered layer 402 covered by an electroless gold layer 404. The base sintered layer 402 is formed of either sintered copper or sintered nickel and is at least partially disposed within the carrier 114. Of course the electroless gold layer 404 could be omitted in one embodiment. To the extent the electroless gold layer 404 is included it may provide for protection against corrosion and, in one embodiment, has a thickness of about 1000 angstroms.

Figure 5:
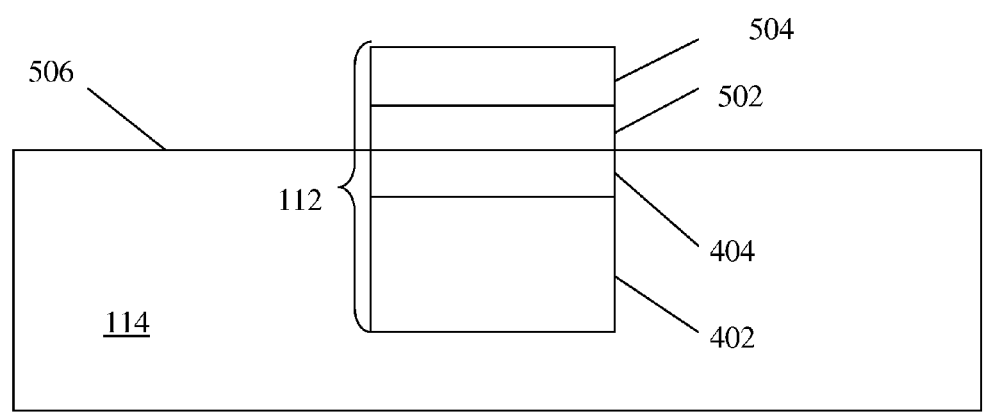
FIG. 5 shows a different example of a contact pad according to one embodiment.

FIG. 5 shows another example of contact pad 112 formed in a substrate 114. The contact pad 112 of this embodiment includes the base sintered layer 402 covered by an electroless gold layer 404 of FIG. 4. In addition, the contact pad 112 includes an electroless copper layer 502 over the electroless gold layer 404 and an additional electroless gold layer 504 over the electroless copper layer 502. As shown, layers 502 and 504 are above an upper surface 506 of the substrate 114. Of course, these layers could be even with or below the upper surface 506 in an alternative embodiment.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of coupling an integrated circuit to a substrate, the method comprising:

providing the substrate;
forming a contact pad in the substrate;
contacting the contact pad with a solder ball; and
repeatedly exposing the solder ball to a thermal process to cause intermetallics based on a metal in the contact pad to be formed in the thermal ball;
wherein the contact pad is formed of at least a sintered base portion and an electroless portion above the sintered based portion.

2. The method of claim 1, wherein the substrate is formed of ceramic.

3. The method of claim 1, wherein the sintered base portion is formed of sintered copper.

4. The method of claim 1, wherein the sintered base portion is formed of sintered nickel.

5. The method of claim 1, wherein the electroless portion is formed of electroless gold.

6. The method of claim 1, wherein the contact pad further includes another two or more additional electroless portions.

7. The method of claim 6, wherein the additional electroless portions include an electroless copper layer over the electroless layer and an electroless gold layer over the electroless copper layer.

8. The method of claim 1, further comprising:
contacting the solder ball to the integrated circuit.

9. A method of coupling an integrated circuit to a substrate, the method comprising:
providing the substrate;
forming a contact pad in the substrate;
contacting the contact pad with a solder ball; and
exposing the solder ball to a thermal process until a desired amount of intermetallics based on a metal in the contact pad are formed in the solder ball;
wherein the contact pad is formed of at least a sintered base portion and an electroless portion above the sintered based portion.

10. The method of claim 9, wherein the substrate is formed of ceramic.

11. The method of claim 9, wherein the sintered base portion is formed of sintered copper.

12. The method of claim 9, wherein the sintered base portion is formed of sintered nickel.

13. The method of claim 9, wherein the electroless portion is formed of electroless gold.

14. The method of claim 9, wherein the contact pad further includes another two or more additional electroless portions.

15. The method of claim 14, wherein the additional electroless portions include an electroless copper layer over the electroless layer and an electroless gold layer over the electroless copper layer.

16. The method of claim 9, further comprising:
contacting the solder ball to the integrated circuit.

* * * * *